United States Patent
Conemac

(10) Patent No.: US 9,303,958 B2
(45) Date of Patent: Apr. 5, 2016

(54) LASER-WEAPON MODULE FOR A PORTABLE LASER WEAPON

(71) Applicant: Advanced Laser Technologies, LLC, Orlando, FL (US)

(72) Inventor: Donald Craig Conemac, Orlando, FL (US)

(73) Assignee: ADVANCED LASER TECHNOLOGIES, LLC, Orlando, FL (US)

( * ) Notice: Subject to any disclaimer, the term of this patent is extended or adjusted under 35 U.S.C. 154(b) by 281 days.

(21) Appl. No.: 14/138,865

(22) Filed: Dec. 23, 2013

(65) Prior Publication Data

US 2015/0369570 A1    Dec. 24, 2015

(51) Int. Cl.

| | |
|---|---|
| *G02B 27/12* | (2006.01) |
| *G03B 21/60* | (2014.01) |
| *G02B 27/10* | (2006.01) |
| *F41H 13/00* | (2006.01) |
| *H01S 5/40* | (2006.01) |
| *H01S 5/024* | (2006.01) |
| *H01S 5/022* | (2006.01) |

(52) U.S. Cl.
CPC .......... *F41H 13/005* (2013.01); *H01S 5/02208* (2013.01); *H01S 5/02469* (2013.01); *H01S 5/4012* (2013.01); *H01S 5/4075* (2013.01)

(58) Field of Classification Search
CPC ............ G02B 27/0172; G02B 27/145; G02B 3/0056; G02B 27/0149; G02B 27/0103; G03B 21/56; G03B 21/625; G03B 21/602

USPC ................ 359/618, 626, 621, 443, 454–455, 359/630–634, 13–14
See application file for complete search history.

(56) References Cited

U.S. PATENT DOCUMENTS

| | | | |
|---|---|---|---|
| 5,015,080 A | * | 5/1991 | Cassarly ............ G02B 26/0875 349/1 |
| 6,134,050 A | | 10/2000 | Conemac |
| 6,404,784 B2 | | 6/2002 | Komine |
| 7,068,699 B2 | | 6/2006 | Nettleton et al. |
| 2004/0008744 A1 | * | 1/2004 | Okazaki ............... H01S 5/4012 372/36 |
| 2008/0158698 A1 | * | 7/2008 | Chang .............. B29D 11/00009 359/819 |
| 2012/0300803 A1 | | 11/2012 | Kangas |

* cited by examiner

*Primary Examiner* — Dawayne A Pinkney
(74) *Attorney, Agent, or Firm* — Terry M. Sanks, Esq.; Beusse Wolter Sanks & Maire, PLLC

(57) ABSTRACT

A laser-weapon module (12) as may be used in a laser weapon (10), such a portable laser gun is provided. A first mount assembly (18) includes recesses (20) distributed in mount assembly (18). Laser beamlet assemblies (22), such as may include laser diodes, are disposed in recesses (20). A second mount assembly (24) is disposed forwardly from mount assembly (18) and includes recesses (26) distributed in mount assembly (24). Laser beamlet assemblies (28) are disposed in the recesses (26) in mount assembly (24), which includes a plurality of beamlet-transmissive portions (30) positioned to pass laser beamlets from laser beamlet assemblies (22). A focusing lens (32) is positioned forwardly of mount assemblies (18, 24) to focus respective laser beamlets (34) emitted from either of laser beamlet assemblies (22, 28) to form a beam (36) of laser energy to be directed to a target (38). The power level of beam 36 may be scalable.

20 Claims, 3 Drawing Sheets

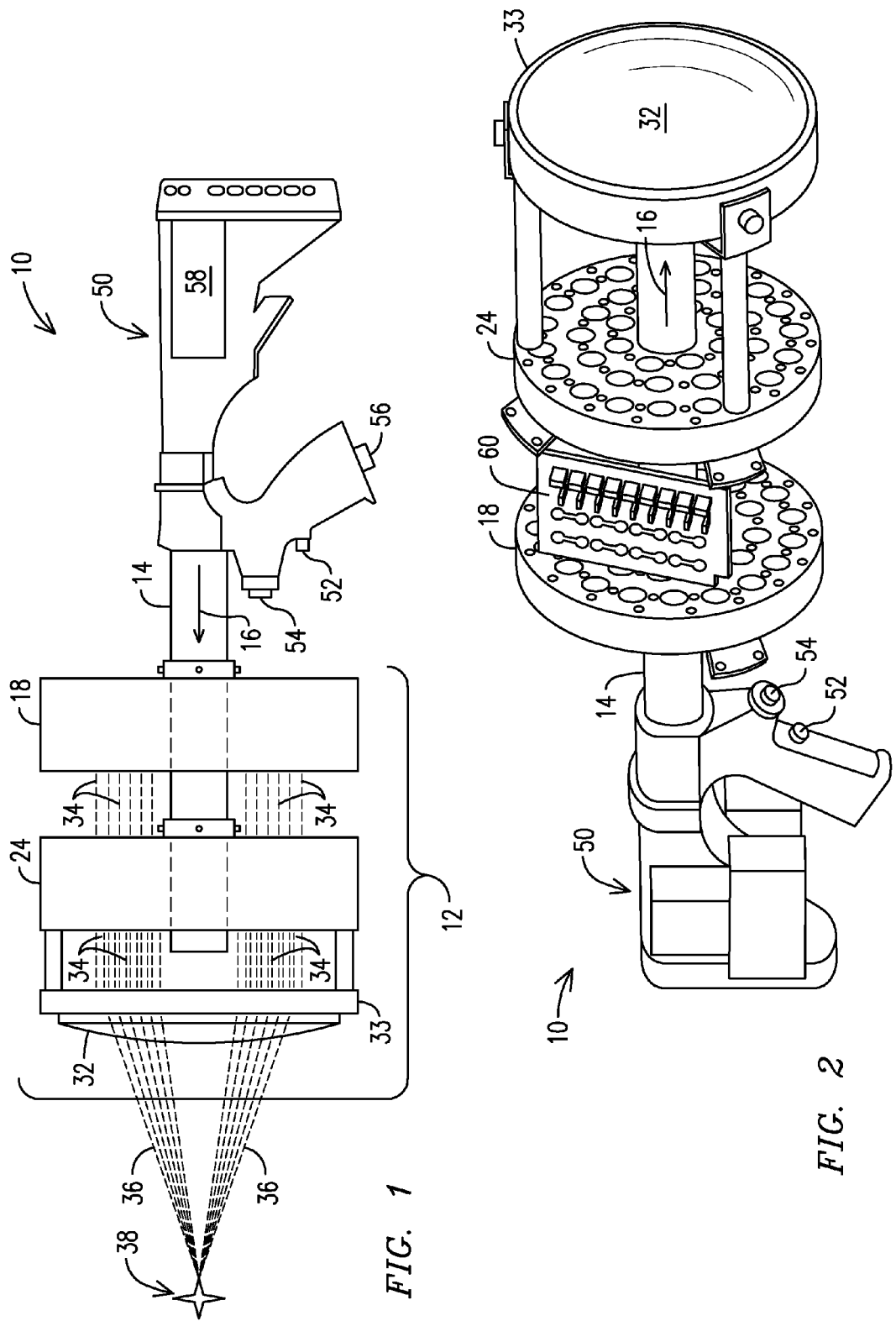

LASER-WEAPON MODULE FOR A PORTABLE LASER WEAPON

FIELD OF THE INVENTION

The present invention relates to lasers, and, more particularly, to a laser-weapon module that may be used in a portable laser weapon, such as a laser gun.

BACKGROUND OF THE INVENTION

Weapons that rely on chemical reactions to propel projectiles have dominated for centuries. The dominance of such weapons is being challenged by advances in high-energy lasers with potential use for a wide array of applications, such as for military, law enforcement and civilian applications.

It is known to combine several relatively low-cost, low-power lasers to achieve a given power output in lieu of using a single, more expensive high-power laser. U.S. Pat. No. 6,134,050 authored by the present inventor discloses one efficient way of combining laser beams, such as for generation of a high-power output laser beam.

BRIEF SUMMARY

Generally, in one non-limiting embodiment, aspects of the present invention are directed to a laser-weapon module. A member may extend along a longitudinal axis of the laser-weapon module. A first mount assembly is affixed to the member and includes a plurality of recesses distributed in the first mount assembly. A first plurality of laser beamlet assemblies is respectively disposed in the recesses in the first mount assembly. A second mount assembly is affixed to the member and is co-axially disposed forwardly from the first mount assembly. The second mount assembly includes a plurality of recesses distributed in the second mount assembly. The respective recesses in the first and second mounts are staggered relative to one another. A second plurality of laser beamlet assemblies is respectively disposed in the recesses in the second mount assembly, which includes a plurality of beamlet-transmissive portions positioned to pass laser beamlets from the first plurality of laser beamlet assemblies. A focusing lens is positioned forwardly of the first and second mount assemblies to focus respective laser beamlets emitted from at least one of the first and second pluralities of laser beamlet assemblies to form a beam of laser energy to be directed to a target.

In another non-limiting embodiment, further aspects of the present invention are directed to a portable laser weapon. A first mount assembly includes a plurality of recesses distributed in the first mount assembly. A first plurality of laser beamlet assemblies is respectively disposed in the recesses in the mount assembly. One or more additional mount assemblies are co-axially disposed forwardly from the first mount assembly and include respective pluralities of recesses, which are staggered relative to one another. One or more additional pluralities of laser beamlet assemblies are respectively disposed in the recesses in the one or more additional mount assemblies, which include a plurality of beamlet-transmissive portions respectively positioned to pass laser beamlets from laser beamlet assemblies disposed rearwardly from the one or more additional mount assemblies. A laser beamlet assembly may include a laser diode and at least one optical element to optically condition a laser beamlet emitted by the laser diode. A focusing lens is positioned forwardly from the one or more additional pluralities of laser beamlet assemblies to focus respective laser beamlets emitted from the first plurality of laser beamlet assemblies and the one or more additional pluralities of energy beamlet assemblies to form a beam of laser energy to be directed to a target.

BRIEF DESCRIPTION OF THE DRAWINGS

The invention is explained in the following description in view of the drawings that show:

FIG. 1 is a schematic of an example laser weapon, such as a portable laser gun, that may benefit from a laser-weapon module embodying aspects of the present invention.

FIG. 2 is an isometric view of an example embodiment of portable laser gun embodying aspects of the present invention.

DETAILED DESCRIPTION OF THE INVENTION

The present inventor has cleverly recognized certain limitations in connection with known devices for generation of a high-power output laser beam in a laser weapon, such as a portable laser gun. It is believed that these limitations have hindered effective utilization of lasers for this type of laser weapon applications where, for example, certain basic challenges need to be appropriately met. Examples of such challenges may be operational reliability, efficient utilization of electrical power, weight and size constraints. For example, efficient assembly of a large number of semiconductor lasers in a limited footprint and/or efficient thermal management of such semiconductor lasers, such as may be conducive to the elimination of cumbersome cooling equipment, has proven to be elusive in known devices.

At least in view of recognition of such limitations, the present inventor proposes an innovative laser-weapon module where individual laser beamlets can be efficiently and reliably combined to form a beam of laser energy having a scalable power that may be used in a laser weapon, such as a portable laser gun. Non-limiting example applications of such a laser weapon may be for military, law enforcement and civilian applications. Moreover, the proposed laser-weapon module provides assemblies that make efficient and judicious use of valuable and limited footprint to increase the number of semiconductor lasers that may be accommodated while providing efficient thermal management, such as by way of thermal convection without having to use cumbersome external cooling equipment.

In the following detailed description, various specific details are set forth in order to provide a thorough understanding of such embodiments. However, those skilled in the art will understand that embodiments of the present invention may be practiced without these specific details, that the present invention is not limited to the depicted embodiments, and that the present invention may be practiced in a variety of alternative embodiments. In other instances, methods, procedures, and components, which would be well-understood by one skilled in the art have not been described in detail to avoid unnecessary and burdensome explanation.

Furthermore, various operations may be described as multiple discrete steps performed in a manner that is helpful for understanding embodiments of the present invention. However, the order of description should not be construed as to imply that these operations need be performed in the order they are presented, nor that they are even order dependent unless otherwise so described. Moreover, repeated usage of the phrase "in one embodiment" does not necessarily refer to the same embodiment, although it may. Lastly, the terms "comprising", "including", "having", and the like, as used in the present application, are intended to be synonymous unless otherwise indicated.

Figure 3:
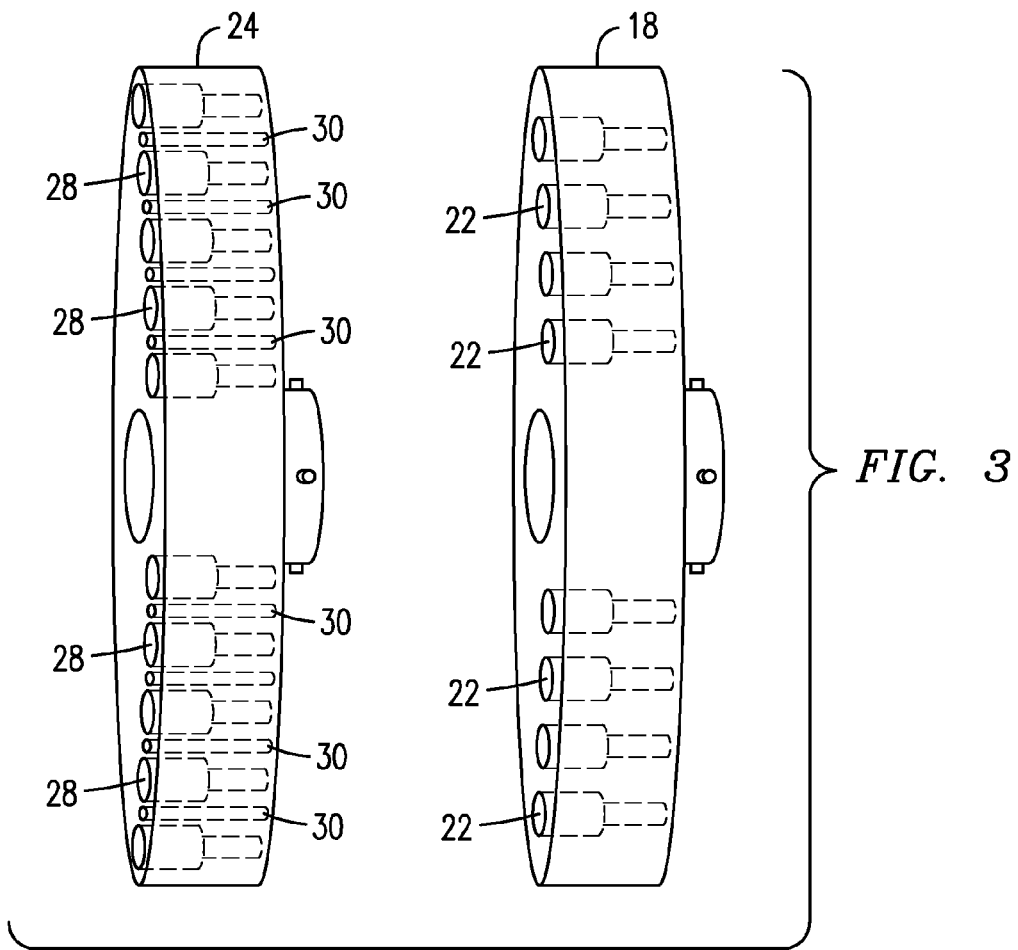
FIG. 3 illustrate respective side views of example embodiments of a first mount assembly and a second mount assembly that may be used in a laser-weapon module embodying aspects of the present invention. The mount assemblies include respective recesses for accommodating respective pluralities of laser beamlet assemblies, as may comprise semiconductor lasers, such as laser diodes, for forming a laser beam having a scalable power level.
Figure 5:
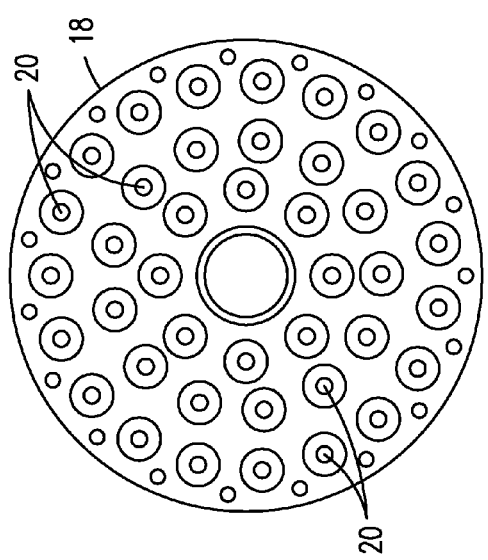

FIG. 1 is a schematic of a laser weapon 10, such as a portable laser gun, that may benefit from a laser-weapon module 12 embodying aspects of the present invention. In one example embodiment, a member 14, such as tubular member, may extend along a longitudinal axis 16 of laser-weapon module 12. A first mount assembly 18 is affixed to member 14 and includes a plurality of recesses 20 (FIG. 5) distributed in the first mount assembly 18. A first plurality of laser beamlet assemblies 22 (FIG. 3) is respectively disposed in the recesses 20 in first mount assembly 18.

Figure 4:
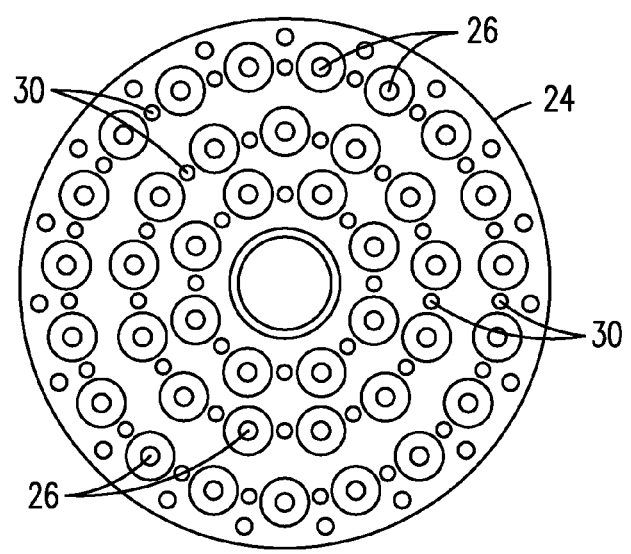
FIGS. 4 and 5 respectively illustrate respective elevational views of example mutually staggered patterns for the recesses in the second and first mount assemblies.

In one example embodiment, one or more additional mount assemblies may be co-axially disposed on member 14 forwardly from first mount assembly 18. For example, a second mount assembly 24 may be affixed to member 14 and may be co-axially disposed forwardly from first mount assembly 18. The second mount assembly includes a plurality of recesses 26 (FIG. 4) distributed in the second mount assembly 24. In one example embodiment, the respective recesses 20, 26 in the first and second mount assemblies 18, 24 are staggered relative to one another. That is, when the first and second mount assemblies 18, 24 are respectively affixed to member 14, the respective relative radial alignment of first and second mount assemblies 18, 24 is Chosen so that the respective recesses 20, 26 are staggered (non-coincidental) relative to one another. As described in greater detail below, this type of staggering arrangement for the respective recesses 20, 26 is useful to accommodate beamlet-transmissive portions (e.g., openings) in at least the second mount assembly 24, which allows passage to laser beamlets which may be emitted by laser beamlet assemblies 22.

A second plurality of laser beamlet assemblies 28 (FIG. 3) is respectively disposed in the recesses 26 in the second mount assembly 24. Second mount assembly 24 includes a plurality of beamlet-transmissive portions 30, such as openings, positioned to pass laser beamlets from the first plurality of laser beamlet assemblies 22. As seen in FIGS. 1 and 2, a focusing lens 32, Which may be mounted on a suitable lens mount 33, is positioned forwardly of first and second mount assemblies 18, 24 to focus respective laser beamlets 34 emitted from at least one of the first and second pluralities of laser beamlet assemblies 22, 28 to form a beam of laser energy 36 to be directed to a target 38.

The power level of the formed laser beam may be scalable based on the number of laser beamlet assemblies 22, 28 which are energized to emit beamlets of laser energy. As will be appreciated by those skilled in the art, this power scaling may be achieved in a variety of ways, such as in response to the amount of trigger pressure applied to a main trigger of the weapon, or in response to the setting in a settable power setting knob.

In one non-limiting prototype embodiment, a total of 40 laser beamlet assemblies were installed in each mount assembly. Thus, in this example embodiment, the formed laser beam may be scalable based on the number of laser beamlet assemblies which are energized out of a total of 80 laser beamlet assemblies. It will be appreciated that aspects of the present invention are not limited to any specific number of laser beamlet assemblies per mount assembly.

For purposes of simplicity of explanation as well as avoiding visual cluttering in the drawings, the foregoing embodiment discusses just two mount assemblies 18, 24; it will be appreciated, however, that aspects of the present invention need not be limited to just two mount assemblies. For example, a third mount assembly (not shown) could be co-axially affixed to member 14 to be co-axially positioned between second mount assembly 24 and focusing lens 32. In this case, such third mount assembly would include a respective plurality of beamlet-transmissive portions respectively positioned to pass energy beamlets from laser beamlet assemblies 22, 28 disposed rearwardly from the third mount assembly.

In one example embodiment, the mount assemblies 18, 24 are designed to function as heat-dissipation structures for dissipating heat discharged during operation of the energy beamlet assemblies 22, 28 respectively disposed in the recesses 20, 26 in the mount assemblies 18, 24. In one example embodiment, mount assemblies 18, 24 may comprise respective metallic rings, such as may be made from a suitable metal material, such as copper, aluminum, silver, etc. In another example embodiment, mount assemblies 18, 24 may comprise a thermally-conductive substrate, such as may comprise a potting compound, a ceramic, a polymer, and a carbon-based material engineered for thermal management. One example of such a carbon-based material may be a graphitic carbon-aluminum material referred to as CarbAl™ heat transfer material available from Applied Nanotech Inc.

Returning to FIG. 1, laser-weapon module 12 may be mechanically affixed by way of member 14 to a gun stock 50, which may include a target switch 52 and a main switch 54. These switches may be sequentially operated (e.g., the target switch 52 followed by the main switch 54) to discharge the laser weapon 10. FIG. 1 further illustrates a power module 58, as may contain a number of rechargeable battery packs for jointly or separately powering the first and second pluralities of laser beamlet assemblies 22, 28. In one non-limiting embodiment, power module 58 may be configured as an ammunition magazine (e.g., shaped like an ammunition magazine for ammunition-based firearms, such as guns, pistols, etc.) and thus effective for quick replacement into a socket or any suitable mechanical interface that may be constructed in gun stock 50. This is conducive to an ergonomically friendly transition for users who may be trained or have familiarity in the handling of standard gun magazines. A charging jack 56 may be electrically connected to an external power source (not shown) to recharge the battery packs in power module 58. It will be appreciated that aspects of the present invention are not limited to any particular location for the power module and/or charging jack. Moreover the configuration of the illustrated gun stock should be construed in an example sense and not in a limiting sense.

FIG. 2 is an isometric view of an example embodiment of laser gun 10. A plurality of circuit boards 60 comprising standard circuit components may be arranged at a periphery of mount assemblies 18, 24 to energize the laser beamlet assemblies in response to appropriate activation of target switch 52 and main switch 54. For the sake of avoiding visual cluttering just one example circuit board 60 is shown in FIG. 2.

Figure 6:
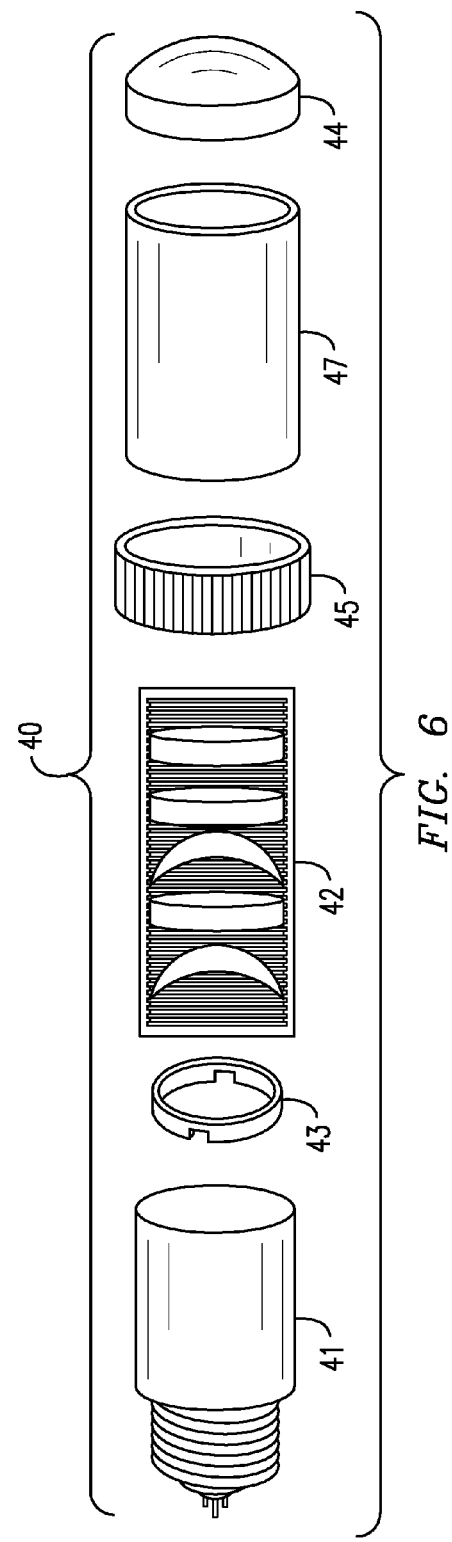
FIG. 6 is an exploded view of one example embodiment of laser beamlet assembly that may be used in a laser-weapon module embodying aspects of the present invention.

FIG. 6 is an exploded view of one example embodiment of laser beamlet assembly 40 that may be used in a laser-weapon module embodying aspects of the present invention. In one example embodiment, laser beamlet assembly 40 may include a semiconductor laser 41, such as a laser diode, and one or more optical elements, such as a focusing tube 42, such as may include one or more lenses and spacers, and a focal lens 44 to optically condition (e.g., collimate and focus) a laser beamlet emitted by semiconductor laser 41. Laser beamlet assembly 40 may additionally include other standard components, such as a retainer ring 43, an end cap 45 and a housing 47.

In one example embodiment, semiconductor laser 41 may be arranged to emit a laser beamlet having a wavelength in a range from approximately 300 nanometers to approximately 1500 nanometers, and, more particularly, in a range from approximately 360 nanometers to approximately 480 nanometers, as may be emitted by a blue laser diode. It will be appreciated that aspects of the present invention are not limited to any particular wavelength or type of semiconductor laser. A blue laser diode may be suitable in applications where beam propagation through water is contemplated. In one non-limiting embodiment, the power level of a laser beamlet emitted by laser beamlet assembly 40 may be in a range from approximately 2.5 Watts to approximately 3.3 Watts in a continuous mode of operation. It will be appreciated that operation of laser beamlet in a pulsed mode is also feasible.

In one example embodiment, the laser beamlet assemblies may be arranged to generate a desired beam-spot shape in the formed laser beam. For example, depending on the needs of a given application, the polarization direction of the laser beamlets could be arranged to provide a desired beam spot shape, such as rectangular, circular, elliptical, etc.

During experiments conducted with a laser gun prototype embodying aspects of the present invention, power efficiency levels approaching approximately 25% (laser beam power/electric power consumption) have been achieved. Target ranges of at least 125 feet have been experimentally demonstrated where a sample target with material properties analogous to soft tissue suffered a piercing hole having a width of approximately 2.4 cm and a depth of approximately 10 cm with a laser beam having a power of approximately 280 Watts and duration of approximately 1 second.

While various embodiments of the present invention have been shown and described herein, it will be obvious that such embodiments are provided by way of example only. Numerous variations, changes and substitutions may be made without departing from the invention herein. Accordingly, it is intended that the invention be limited only by the spirit and scope of the appended claims.

The invention claimed is:

1. A laser-weapon module, comprising:
  a member extending along a longitudinal axis of the laser-weapon module;
  a first mount assembly affixed to the member and having a first plurality of recesses distributed in the first mount assembly;
  a first plurality of laser beamlet assemblies respectively disposed in the first plurality of recesses in the first mount assembly, the first plurality of laser beamlet assemblies to produce first laser beamlets and each laser beamlet assembly of the first plurality of laser beamlet assemblies comprising a semiconductor laser;
  a second mount assembly affixed onto the member and co-axially disposed forwardly from the first mount assembly, the second mount assembly having a second plurality of recesses distributed in the second mount assembly, wherein the first plurality of recesses have a first staggered pattern and the second plurality of recesses have a second staggered pattern such that the first plurality of recesses and the second plurality of recesses are non-coincidental relative to one another;
  a second plurality of laser beamlet assemblies respectively disposed in the recesses in the second mount assembly, the second plurality of laser beamlet assemblies to produce second laser beamlets and each laser beamlet assembly of the second plurality of laser beamlet assemblies comprising a semiconductor laser, the second mount assembly having a plurality of beamlet-transmissive portions positioned to pass therethrough the first laser beamlets from the first plurality of laser beamlet assemblies according to the first staggered pattern; and
  a focusing lens positioned forwardly of the first and second mount assemblies to focus the first laser beamlets emitted from at least one of the first plurality of laser beamlet assemblies and the second laser beamlets from at least one of the second plurality of laser beamlet assemblies to form a beam of laser energy to be directed to a target wherein the at least one of the first plurality of the laser beamlet assemblies and the at least one of the second plurality of laser beamlet assemblies are energized in response to activation of a switch on a weapon.

2. The laser-weapon module of claim 1, wherein said each laser beamlet assembly of the first plurality of laser beamlet assemblies and the second plurality of laser beamlet assemblies comprises at least one optical element to optically condition a laser beamlet emitted by the semiconductor laser.

3. The laser-weapon module of claim 2, wherein the semiconductor laser comprises a laser diode.

4. The laser-weapon module of claim 2, wherein the semiconductor laser is configured to emit a laser beamlet having a wavelength in a range from approximately 300 nanometers to approximately 1500 nanometers.

5. The laser-weapon module of claim 4, wherein the wavelength range is from approximately 360 nanometers to approximately 480 nanometers.

6. The laser-weapon module of claim 1, comprising at least one further mount assembly affixed onto the member and co-axially located between the second mount assembly and the focusing lens, and at least one further plurality of laser beamlet assemblies respectively disposed in recesses in the at least one further mount assembly, the at least one further mount assembly having a plurality of beamlet-transmissive portions positioned to pass laser beamlets from any respective laser beamlet assemblies disposed rearwardly from the at least one further mount assembly.

7. The laser-weapon module of claim 1, wherein a power level of the formed laser beam is scalable based on a number of laser beamlet assemblies which are energized to emit beamlets of laser energy.

8. The laser-weapon module of claim 1, wherein the mount assemblies comprise respective heat-dissipation structures for dissipating heat discharged by the energy beamlet assemblies respectively disposed therein.

9. The laser-weapon module of claim 8, wherein the mount assemblies comprise respective metallic rings.

10. The laser-weapon module of claim 8, wherein the mount assemblies comprise a thermally-conductive substrate selected from the group consisting of a potting compound, a ceramic, a polymer and a carbon-based material engineered for thermal management.

11. The laser-weapon module of claim 1, wherein the laser beamlet assemblies are arranged to generate a desired beam-spot shape in the formed laser beam.

12. A portable laser weapon comprising the laser-weapon assembly of claim 1.

13. The portable laser weapon of claim 12, comprising a laser gun configured to strike the target with a selectable power level in the formed laser beam.

14. The portable laser weapon of claim 12, including a power module comprising a number of rechargeable battery packs for jointly or separately powering the first and second pluralities of laser beamlet assemblies, wherein the power module is configured as an ammunition magazine.

15. A portable laser weapon comprising:
a first mount assembly having a plurality of recesses distributed in the first mount assembly;
a first plurality of laser beamlet assemblies respectively disposed in the recesses in the mount assembly, the first plurality of laser beamlet assemblies to produce first laser beamlets and each laser beamlet assembly of the first plurality of laser beamlet assemblies comprising a semiconductor laser;
one or more additional mount assemblies co-axially disposed forwardly from the first mount assembly, the one or more additional mount assemblies having respective pluralities of recesses, wherein the recesses in the first mount assembly and recesses in the one or more additional mount assemblies are staggered and non-coincidental relative to one another;
one or more additional pluralities of laser beamlet assemblies respectively disposed in the recesses in the one or more additional mount assemblies, the one or more additional plurality of laser beamlet assemblies to produce one or more additional laser beamlets and each laser beamlet assembly of the one or more additional plurality of laser beamlet assemblies comprising a semiconductor laser, the one or more additional mount assemblies having a plurality of beamlet-transmissive portions respectively positioned to pass therethrough laser beamlets from laser beamlet assemblies disposed rearwardly from the one or more additional mount assemblies; and
a focusing lens positioned forwardly from the one or more additional pluralities of laser beamlet assemblies to focus the first laser beamlets emitted from the first plurality of laser beamlet assemblies and the one or more additional laser beamlets from the one or more additional pluralities of laser beamlet assemblies to form a beam of laser energy to be directed to a target wherein the at least one of the first plurality of the laser beamlet assemblies and the at least one of the one or more additional pluralities of laser beamlet assemblies are energized in response to activation of a switch on the weapon.

16. The portable weapon of claim 15, wherein a power level of the formed laser beam is scalable based on a number of laser diodes which are energized to emit beamlets of laser energy.

17. The portable weapon of claim 15, wherein the mount assemblies comprise respective heat-dissipation structures for dissipating heat discharged by the laser diodes respectively disposed therein.

18. The portable weapon of claim 15, wherein the laser beamlet assemblies are arranged to generate a desired beam-spot shape in the formed laser beam.

19. The portable weapon of claim 15, comprising a laser gun configured to strike the target with a selectable power level and/or a desired beam-spot shape in the formed laser beam.

20. The portable weapon of claim 15, wherein the laser diodes in the laser beamlet assemblies are configured to emit respective laser beamlets having a wavelength in a range from approximately 300 nanometers to approximately 1500 nanometers.

* * * * *